(12) United States Patent
Hook et al.

(10) Patent No.: US 7,492,016 B2
(45) Date of Patent: Feb. 17, 2009

(54) PROTECTION AGAINST CHARGING DAMAGE IN HYBRID ORIENTATION TRANSISTORS

(75) Inventors: Terence B. Hook, Jericho, VT (US); Anda C. Mocuta, LaGrangeville, NY (US); Jeffrey W. Sleight, Ridgefield, CT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 11/308,513

(22) Filed: Mar. 31, 2006

(65) Prior Publication Data

US 2007/0228479 A1 Oct. 4, 2007

(51) Int. Cl.
*H01L 23/62* (2006.01)
(52) U.S. Cl. ............................. 257/369; 257/E27.112
(58) Field of Classification Search ............ None
See application file for complete search history.

(56) References Cited

U.S. PATENT DOCUMENTS

| | | | |
|---|---|---|---|
| 5,661,069 A | 8/1997 | Owens et al. |
| 5,760,445 A | 6/1998 | Diaz |
| 5,994,742 A | 11/1999 | Krishnan et al. |
| 6,048,761 A | 4/2000 | En |
| 6,074,899 A | 6/2000 | Voldman |
| 6,117,714 A | 9/2000 | Beatty |

(Continued)

FOREIGN PATENT DOCUMENTS

JP 2000150666 5/2000

(Continued)

OTHER PUBLICATIONS

M. Yang et al. "High Performance CMOS Fabricated on Hybrid Substrate With Different Crystal Orientations." *IBM Semiconductor Research and Development Center.* Yorktown Heights: 2003, p. IEDM 03-453-IEDM 03-456.

(Continued)

*Primary Examiner*—Evan Pert
*Assistant Examiner*—Ben P Sandvik
(74) *Attorney, Agent, or Firm*—Daryl Neff; Lisa U. Jaklitsch

(57) ABSTRACT

A chip includes a CMOS structure having a bulk device disposed in a first region of a semiconductor substrate in conductive communication with an underlying bulk region of the substrate, the first region and the bulk region having a first crystal orientation. A SOI device is disposed in a semiconductor-on-insulator ("SOI") layer separated from the bulk region of the substrate by a buried dielectric layer, the SOI layer having a different crystal orientation from the first crystal orientation. In one example, the bulk device includes a p-type field effect transistor ("PFET") and the SOI device includes an n-type field effect transistor ("NFET") device. Alternatively, the bulk device can include an NFET and the SOI device can include a PFET. When the SOI device has a gate conductor in conductive communication with a gate conductor of the bulk device, charging damage can occur to the SOI device, except for the presence of diodes in reverse-biased conductive communication with the bulk region. The diodes are operable to conduct a discharge current to the bulk region when either a voltage on the gate conductor or a voltage on the source or drain region of the SOI device exceeds a diode's breakdown voltage.

5 Claims, 3 Drawing Sheets

U.S. PATENT DOCUMENTS

| | | | |
|---|---|---|---|
| 6,128,173 A | 10/2000 | Iwasaki | |
| 6,277,708 B1 | 8/2001 | Bothra et al. | |
| 6,291,281 B1 | 9/2001 | Wang et al. | |
| 6,292,927 B1 | 9/2001 | Gopisetty et al. | |
| 6,294,427 B1 | 9/2001 | Furuhata et al. | |
| 6,337,502 B1 | 1/2002 | Eitan et al. | |
| 6,417,541 B1 | 7/2002 | Cai et al. | |
| 6,417,544 B1 | 7/2002 | Jun et al. | |
| 6,433,403 B1 | 8/2002 | Wilford | |
| 6,451,234 B1* | 9/2002 | Cliver et al. | 264/78 |
| 6,559,485 B2 | 5/2003 | Aoyama | |
| 6,624,480 B2 | 9/2003 | Lin et al. | |
| 6,627,555 B2 | 9/2003 | Eitan et al. | |
| 6,788,507 B2* | 9/2004 | Chen et al. | 361/56 |
| 2002/0024849 A1* | 2/2002 | Kato et al. | 365/185.28 |
| 2003/0122190 A1* | 7/2003 | Gallia et al. | 257/347 |
| 2005/0093105 A1* | 5/2005 | Yang et al. | 257/627 |
| 2005/0199984 A1* | 9/2005 | Nowak | 257/627 |
| 2006/0049460 A1 | 3/2006 | Chen et al. | |

FOREIGN PATENT DOCUMENTS

| | | |
|---|---|---|
| JP | 2001060687 | 3/2001 |

OTHER PUBLICATIONS

A. Mocuta et al., "Plasma Charging Damage in SOI Technology," *International Symp. on Plasma Process Induced Damage*, 2001, pp. 104 et seq.

International Search Report and Written Opinion for FIS920050020.

* cited by examiner

PROTECTION AGAINST CHARGING DAMAGE IN HYBRID ORIENTATION TRANSISTORS

BACKGROUND OF THE INVENTION

The present invention relates to semiconductor integrated circuits and more particularly to structures and methods for protection against charging damage, especially during fabrication of integrated circuits.

Increased performance of integrated circuits is a continual goal of integrated circuit design. Complementary metal oxide semiconductor ("CMOS") circuits utilize both n-type field effect transistors ("NFETs") and p-type field effect transistors ("PFETs"). Because of the different ways in which NFETs and PFETs operate, performance is most improved in CMOS circuits when conditions under which NFETs and PFETs operate are specially tailored to the unique needs of each type of transistor.

Hybrid orientation technology ("HOT") refers to a way of manufacturing CMOS circuits in which the NFET has a longitudinal direction aligned with one crystal orientation of a semiconductor substrate and the PFET has a longitudinal direction aligned with a different crystal orientation of the substrate. Higher on-current and faster switching can be achieved in an NFET when the longitudinal direction (direction of a length of the channel region) is oriented in accordance with the <001> crystal orientation, due to the greater mobility of electrons in that crystal orientation. In addition, higher on-current and faster switching can be achieved in a PFET for which the longitudinal direction is oriented in accordance with the <110> crystal orientation, due to the greater mobility of holes in that crystal orientation. Unfortunately, the longitudinal directions of the NFET and the PFET cannot be aligned with these different crystal orientations simply by laying out the NFET and the PFET in different horizontal directions parallel to the top surface i.e., the major surface of the semiconductor substrate. The <001> crystal orientation is oriented at an angle with respect to a plane in which the <110> crystal orientation runs. Therefore, transistors having these different crystal orientations can only be achieved by forming regions of the semiconductor substrate which have different crystal orientations and fabricating the NFET and the PFET in these different regions.

Through use of bonded semiconductor-on-insulator ("SOI") and epitaxial growth techniques, it is possible to provide semiconductor regions at the major surface of a substrate which have different crystal orientations. However, new problems arise in conductively connecting SOI transistor regions to bulk semiconductor substrate regions through epitaxial regions. These problems include greater susceptibility to electrostatic discharge damage during fabrication.

Certain processes utilized in the fabrication of semiconductor integrated circuits such as plasma etching and deposition can cause electrostatic charges to build up on metal or other conductor structures of such circuits. When unprotected, certain semiconductor devices, especially those which include thin dielectric structures, can be damaged by excessively high voltages across the dielectric structures. In particular, high voltages applied to gate conductors or semiconductor regions of field effect transistors can cause the gate dielectric layers of NFETs and PFETs to break down, rendering them inoperative.

Hybrid orientation technology ("HOT") uses both a bulk device, e.g., transistor, and a SOI device in the same circuit. HOT contrasts with conventional technologies in which individual circuits are implemented by either using only bulk devices or by using only SOI devices. Traditionally, the bulk devices need diode protection against process induced charging damage while SOI devices are inherently robust and do not require any protection. In some circuit designs, bulk devices and SOI devices share terminals, causing new situations for charging damage to occur. For these reasons, new protection schemes become necessary for protecting devices in HOT circuits against charging damage.

SUMMARY OF THE INVENTION

In an embodiment of the invention, a chip is provided which includes a hybrid orientation complementary metal oxide semiconductor ("CMOS") structure. In the CMOS structure, a bulk device is disposed in a first region of a semiconductor substrate in conductive communication with an underlying bulk region of the substrate, where the first region and the bulk region have a first crystal orientation and the bulk device further includes a first gate conductor overlying the first region. A SOI device is disposed in a semiconductor-on-insulator ("SOI") layer separated from the bulk region of the substrate by a buried dielectric layer. The SOI layer has a second crystal orientation different from the first crystal orientation and the SOI device includes a second gate conductor overlying the SOI layer of the substrate. In one preferred embodiment of the invention, the second gate conductor is in conductive communication with the first gate conductor.

The CMOS structure further includes a first diode disposed in a second region of the substrate in conductive communication with the bulk region. The first diode has a cathode in conductive communication with at least the first gate conductor and has an anode in conductive communication with the bulk region of the substrate. The first diode has a breakdown voltage in excess of which the first diode is highly conductive, such that the first diode is operable to conduct a discharge current to the bulk region when a voltage on the first gate conductor exceeds the breakdown voltage. A second diode is disposed in a third region of the substrate in conductive communication with the bulk region. The second diode has a cathode in conductive communication with the source region or the drain region of the SOI device. The second diode is operable to conduct a discharge current to the bulk region when the voltage on the source region or the drain region of the SOI device exceeds its breakdown voltage.

In one example, the bulk device includes a p-type field effect transistor ("PFET") and the SOI device includes an n-type field effect transistor ("NFET") device. Alternatively, the bulk device can include an NFET and the SOI device can include a PFET. The SOI device can have a gate conductor in conductive communication with a gate conductor of the bulk device. In such case, without the diodes for protecting them, charging damage could occur to the bulk device and to the SOI device.

DETAILED DESCRIPTION

Figure 1:
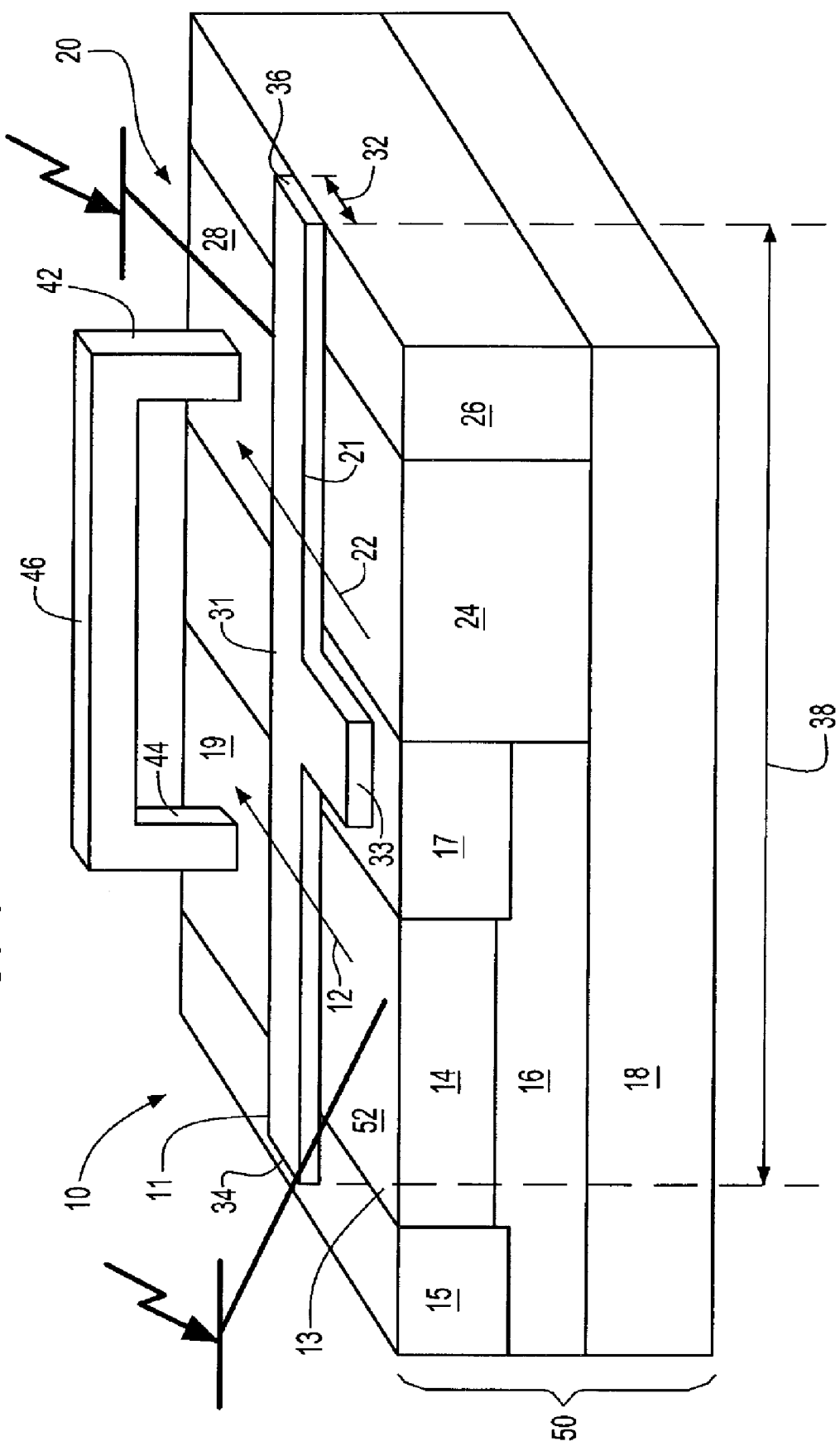
FIG. 1 is a perspective view illustrating a CMOS structure such as a CMOS logic inverter which is implemented in hybrid orientation technology ("HOT") in accordance with an embodiment of the invention.

Accordingly, embodiments of the invention are provided herein by which transistors of hybrid orientation technology ("HOT") chips are protected from charging damage during their fabrication. When CMOS logic circuits are implemented in HOT chips, NFETs are aligned with one crystal orientation, e.g., the <001> orientation, of semiconductor material within a substrate and PFETs are aligned with a different crystal orientation, e.g., the <110> crystal orientation, of the semiconductor material. Such substrate includes, illustratively, a semiconductor-on-insulator ("SOI") layer at a major surface of the substrate which has a <001> orientation in which an NFET is provided, and an epitaxial region having a <110> crystal orientation at a major surface of the substrate in which a PFET is provided, the <110> orientation region being in contact with a bulk region of the substrate having the <110> crystal orientation. Alternatively, in another arrangement, a PFET having the <110> crystal orientation is provided in a SOI layer at a major surface of the substrate, and an NFET having the <001> crystal orientation is provided in an epitaxial region at the major surface of the substrate which is in contact with a <001> crystal orientation bulk region. Other arrangements are also possible in which the PFET and the NFET have different crystal orientations from those mentioned above. In any case, HOT circuits include at least one "bulk device" and at least one "SOI device." By "bulk device" is meant a device, for example, a PFET or an NFET in which the body of the device is disposed in conductive communication with a bulk semiconductor region. By "SOI device" is meant a device, for example, a PFET or an NFET which has a body disposed in a SOI layer of substrate which is at least substantially conductively isolated from the bulk semiconductor region.

For purposes of illustration, the above example will now be discussed in which the bulk device is a PFET and the SOI device is an NFET. In such example, the PFET has an on-current conduction path disposed in an epitaxial layer in conductive communication with the bulk semiconductor region of the substrate. By contrast, the NFET has an on-current conduction path disposed in a SOI layer which is at least substantially conductively isolated from the bulk semiconductor region. To form a substrate having different regions at the surface of the substrate with these different crystal orientations, one begins with a semiconductor substrate which has a bulk semiconductor region having the <110> crystal orientation exposed at a major surface. That substrate is bonded with another substrate having the <001> crystal orientation and is then processed, such as by grinding or cleaving, to form a SOI substrate. The resulting SOI substrate has a SOI layer having a <001> crystal orientation exposed at the major surface which overlies a bulk semiconductor region having the <110> crystal orientation, the SOI layer being separated from the bulk region by a buried dielectric layer, e.g., a buried oxide ("BOX") layer. Subsequently, openings are formed which extend through the SOI layer and the BOX layer to expose a portion of the underlying bulk semiconductor region. Then, an epitaxial semiconductor layer having the <110> crystal orientation is grown on the exposed portion of the bulk semiconductor region. Preferably, further processing is performed to planarize the substrate such that the exposed surfaces of the epitaxially grown semiconductor layer and the SOI layer are planarized relative to each other at the major surface of the substrate.

From the modified SOI substrate having an exposed epitaxially grown region connected to the bulk region, processing can then be performed to form an NFET and a PFET in regions at the surface of the substrate which have different crystal orientations.

Thus, in a chip fabricated in accordance with an embodiment of the invention, a hybrid orientation complementary metal oxide semiconductor ("CMOS") structure includes a PFET disposed in a first region of a semiconductor substrate in conductive communication with an underlying bulk region of the substrate, the first region and the bulk region having a first crystal orientation, and the PFET including a first gate conductor overlying the first region of the substrate. An n-type field effect transistor ("NFET") is disposed in a semiconductor-on-insulator ("SOI") layer separated from the bulk region of the substrate by a buried dielectric layer, the SOI layer having a second crystal orientation which is different from the first crystal orientation. The NFET includes a second gate conductor overlying the SOI layer of the substrate, and the second gate conductor is in conductive communication with the first gate conductor. The hybrid CMOS structure further includes a first diode disposed in a second region of the substrate in conductive communication with the bulk region, the first diode having a cathode in conductive communication with the first and second gate conductors. The first diode also includes an anode in conductive communication with the second region and the first diode has a breakdown voltage in excess of which the first diode is highly conductive. In this way, the first diode is operable to conduct a discharge current to the bulk region when a voltage on the first and second gate conductors exceeds the breakdown voltage of the first diode.

FIG. 1 illustrates a CMOS inverter implemented in hybrid orientation technology. As illustrated therein, the inverter includes an NFET 10 and a PFET 20 disposed in regions of a semiconductor substrate 50 having different crystal orientations. The NFET 10 has a source drain conduction path 12 which runs parallel to a plane of the major surface 52 of the substrate in a SOI layer 14 of the substrate. Preferably, the source drain conduction path of the NFET is aligned to the <001> crystal orientation of the semiconductor material and preferably, the semiconductor material is single-crystal silicon. Within the substrate 50, the SOI layer 14 is separated in a vertical direction from a bulk semiconductor region 18 by a buried dielectric layer 16, the buried dielectric layer preferably being a buried oxide ("BOX") layer. The SOI layer is laterally separated from other parts of the substrate by one or more isolation regions, these preferably being shallow trench isolation ("STI") regions 15, 17. Preferably, the bulk region 18 of the semiconductor substrate consists essentially of monocrystalline, i.e., "single-crystal" silicon and the buried dielectric layer 16 consists essentially of one or more oxides of silicon, the dielectric layer preferably including a substantial proportion of silicon dioxide.

The PFET 20 is disposed in an epitaxial single-crystal region 24 of silicon, the epitaxial region overlying the bulk region 18 of the substrate and having the same crystal orientation as the bulk region, that preferably being the <110> crystal orientation. The epitaxial region preferably is laterally separated from other parts of the substrate by the STI region 17 and one or more additional STI regions 26. The PFET 20 has a source drain conduction path 22 which is disposed in the epitaxial layer 24 of the substrate. Like that of the NFET, the source drain conduction path 22 of the PFET 20 also runs in a direction parallel to a plane of the major surface 52 of the substrate. A first gate conductor 11 overlies the SOI layer 14 as a gate conductor of the NFET and is separated from the SOI layer 14 by a gate dielectric layer, typically being a layer of dielectric material having a thickness from between about 7 angstroms to about 50 angstroms. A second gate conductor 21 overlies the epitaxial layer 24 as a gate conductor of the PFET and is separated from the epitaxial layer by a gate dielectric.

The gate conductors can have a uniform composition or preferably include an arrangement of stacked layers which can include one or more semiconductors, e.g., polysilicon, one or more metals and/or one or more conductive compounds of metals and/or one or more thin barrier layers which can include compounds of metals and even a dielectric layer a tunneling thickness, among other possible materials. In the example shown in FIG. 1, The gate conductors 11, 21 of a SOI NFET device and a bulk PFET device, respectively can be connected to each other at the gate conductor level in form of a unitary gate conductor which extends over the SOI layer 14, the epitaxial layer 24 and over the shallow trench isolation regions 15, 17 and 26, as shown in FIG. 1. Alternatively, the gate conductors of the SOI and bulk devices can be connected together at a higher metal level, depending on the particular circuit design and layout. In many types of circuits, the source regions and the drain regions of transistors are not differentiated by structure, but rather by use and their interconnection to other elements of a circuit. For that reason, they can be called source/drain regions instead of differentiated source regions and drain regions. However, with respect to the normal flow of current during operation within a circuit, one of the source/drain regions of each device operates as a source region and the other one operates as a drain region. Also, the source/drain regions of NFET and PFET devices can be connected at the first metal level or a higher metal level, depending on the circuit design and layout.

Process induced charging damage issues in HOT CMOS technology are now illustrated using the example of a CMOS inverter as illustrated in FIG. 1. A contact pad 33 juts out laterally from the linearly extending portion over the STI region 17 between the NFET and the PFET. Electrical contact to the unitary gate conductor is established through a conductive via (not shown) which extends vertically upward from the contact pad 33 to a metal wiring layer of the chip above the major surface 52 of the substrate. In the CMOS inverter circuit illustrated in FIG. 1, a drain region 28 of the PFET is connected in conductive communication with a drain region 19 of the NFET through conductive vias 42 and 44 and a conductive metal line 46 of a metal layer above the major surface 52 of the substrate 50.

Plasma processes used to fabricate the metal wiring can cause damage to a thin gate dielectric which is disposed between the unitary gate conductor 31 and the SOI layer 14 and epitaxial layer 24, respectively. During metal interconnect fabrication, the gate conductor 31 collects charge through higher metal levels connected to it that are exposed to the plasma. Processes that can cause damage include via etch, liner deposition, metal deposition, and chemical-mechanical polishing. The electric potential on the gate conductor potential becomes elevated during interconnect processing. At the same time, the source/drain regions and drain terminals of both NFET and PFET devices can collect charge during the same processes. For the bulk device (the PFET in this example), this charge is drained through the substrate such that the electric potential on the source/drain potential remains close to zero. A large potential difference in the electric potential can build across the gate dielectric of the PFET, resulting in gate dielectric breakdown. For the SOI device (the NFET in this example), the source/drain potential rises during processing to a level close to that of the gate conductor such that no damage is caused to the gate dielectric damage. This is due to the presence of the insulating BOX layer 16, which at least substantially isolates the source/drain regions and the body of the transistor from the rest of the substrate, allowing their electric potentials to float.

In the CMOS inverter circuit illustrated in FIG. 1, the conductive line 46 which connects the drain regions of the NFET 10 and PFET 20 together is provided at a relatively high metal level of the chip such as the third metal wiring level of the chip which is commonly referred to as "M3". While the conductive line 46 operates to keep the drain regions of the two transistors at the same electric potential in the fully completed CMOS structure, there is a problem that before the M3 conductive line 46 has been fabricated, the electric potential of the SOI layer 14 floats and may acquire a substantial charge and voltage during dielectric deposition and patterning processes which precede the formation of the conductive line. Stated another way, in the arrangement illustrated in FIG. 1, the M3 layer conductive line 46 is fabricated after damage might have already been suffered by the CMOS structure due to the accumulation of electrostatic charge during fabrication.

Figure 2:
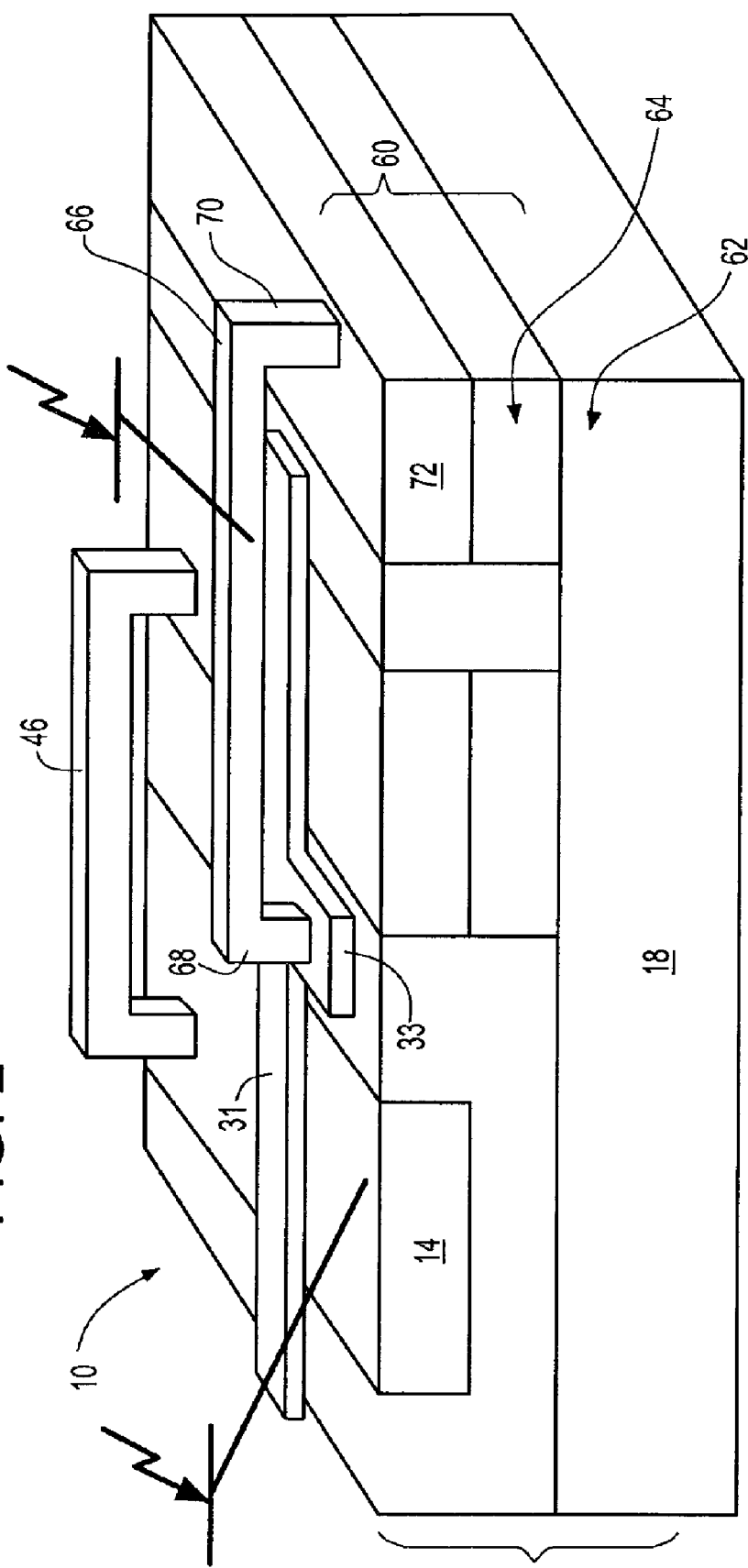
FIG. 2 is a perspective view illustrating a CMOS structure according to another embodiment of the invention which additionally includes a protect diode conductively connected between a unitary gate conductor of the NFET and PFET of the CMOS structure and a bulk region of the substrate.

Traditionally, for bulk devices, charging damage protection has been provided through diode protection of the gate as illustrated in FIG. 2. For example, the gate conductor of the PFET 20 can be conductively connected to a diode 60, known as a "protect diode". The protect diode, which is reverse-biased relative to the bulk semiconductor region 18 of the substrate, has a cathode 62 provided in the bulk region of the substrate and an anode 64 provided in the epitaxial region, including an n+ doped region 72 at the major surface and an n-doped well portion 64 below the region 72. The protect diode limits the electric potential that can build up on the gate terminal including the gate conductor. However, in the case of HOT technology, this diode connection to the gate conductor can result in charging damage of the NFET gate dielectric since the source/drain terminals can still rise to a high electric potential during processing.

Contact between the gate conductor and the protect diode is provided by a conductive line 66 of a metal wiring layer, such as a first wiring layer or "M1" wiring layer that is connected by a conductive via 68 at one end to the contact pad 33 of the gate conductor. The conductive line also has another end connected by another conductive via 70 to a p+ doped semiconductor region 72 that overlies the protect diode 60. With this arrangement, whenever a voltage builds up on the unitary gate conductor 31 that exceeds the breakdown voltage of the protect diode 60, the protect diode 60 discharges the excessive voltage to the bulk region 18 of the substrate. As the bulk region 18 provides a ground reference, the operation of the protect diode discharges the excessive voltage on the gate conductor 31 to ground.

It can be further seen that providing the conductive line 66 in the M1 metal layer rather than a higher, e.g., M2 or M3, etc., metal layer is beneficial, because the connection between the gate conductor 31 and the protect diode 60 is present from a relatively early point in the fabrication process. Once the conductive line 66 and conductive vias 68, 70 have been formed to connect the line to the pad 33 and to the protect diode 60, the protect diode 60 protects the PFET against charging damage during subsequent fabrication processes.

However, further protection can still be provided against damage to the NFET 10 due to the build-up of electrostatic charges in the SOI layer 14. The need for such protection is felt especially prior to the time that the conductive line 46 is formed for connecting the drain regions 19 and 28 of the NFET and PFET together, respectively.

Figure 3:
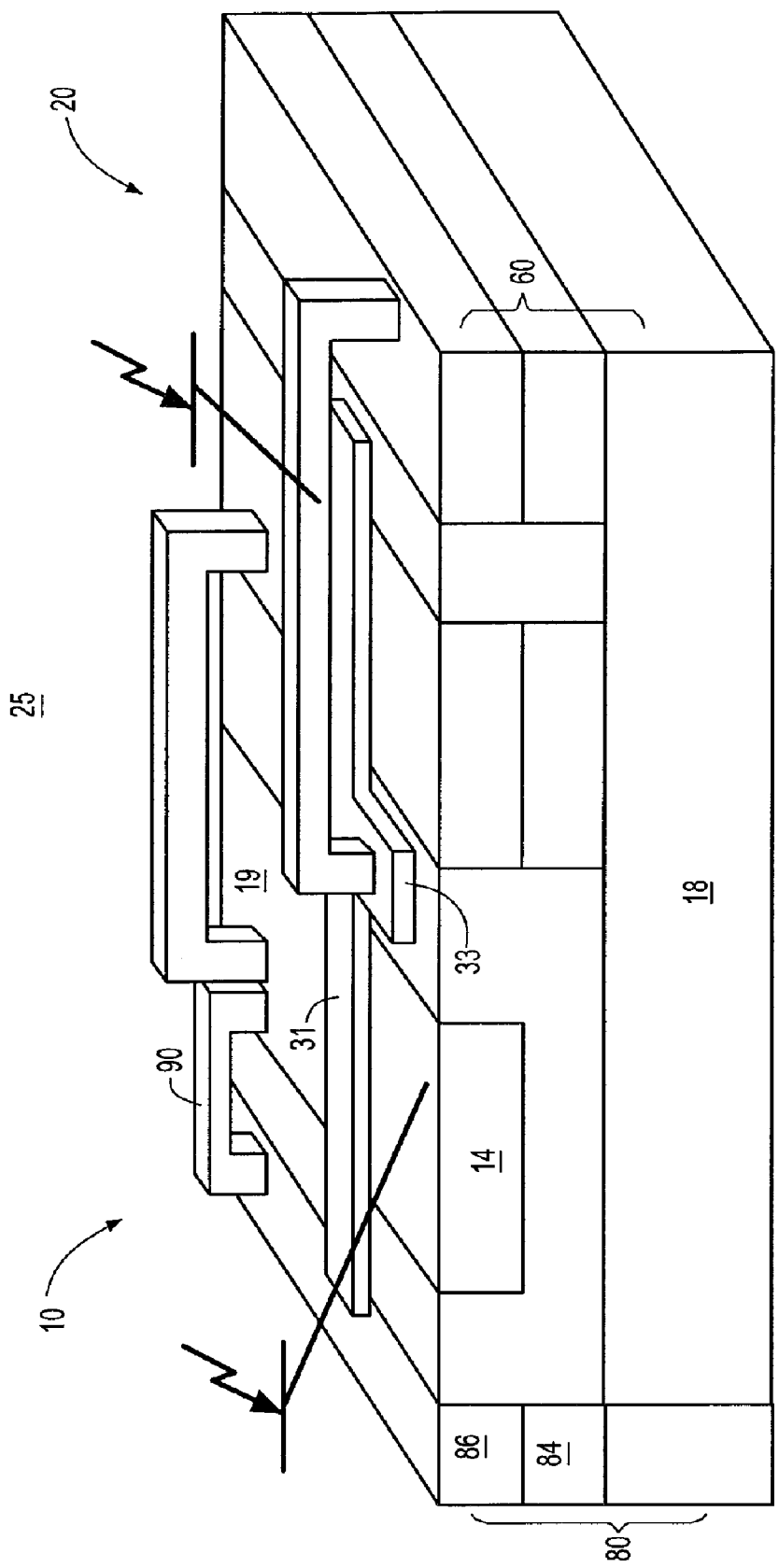
FIG. 3 is a perspective view illustrating a CMOS structure according to another embodiment of the invention which additionally includes a protect diode conductively connected between one of a source or a drain region of the NFET and a bulk region of the substrate.

For HOT technology, a diode 80 (FIG. 3) is conductively connected to at least one of the source region or drain region of the SOI device (NFET) to protect the NFET against plasma process induced gate dielectric damage (FIG. 3). It should be noted that diode protection of SOI NFET device source and drain regions is necessary only in cases where such regions are not conductively connected to the source region of a PFET or drain region of a PFET. In the embodiment of the invention shown in FIG. 3, the additional protect diode 80 is provided which is similar to the first protect diode 60. The additional protect diode has a cathode which includes an n+ doped region 86 at the major surface and an n-type well region 84, both provided in an epitaxial semiconductor layer. The cathode overlies the p− doped bulk region 18 of the substrate which serves as the anode of the diode. Conductive contact is provided between the drain region 19 of the NFET 10 and the n+ doped region 86 through a conductive line 90 and conductive contact vias which connect the conductive line to each of the n+ doped region 86 and the drain region 19 of the NFET.

As in the case of conductive line 66, with the conductive line 90 provided in the M1 metal layer rather than a higher, e.g., M2 or M3, etc., metal layer, the connection between the NFET drain region 19 and the additional protect diode 80 is also present from a relatively early point in the fabrication process. Once the conductive line 90 and the conductive vias extending thereto have been formed, the protect diode 80 protects the NFET 10 against charging damage during subsequent fabrication processes.

The CMOS structure such as that shown in FIG. 3, having protect diodes 60 and 80 conductively connected to both the unitary gate conductor 31 and to the source drain conduction path, i.e., specifically, to the drain region 19 of the NFET 10, both the PFET 20 and the NFET 10 are protected against excessive voltages brought on by accumulation of electrostatic charge during fabrication. Specifically, the protect diodes 60 and 80 protect a CMOS inverter structure 25 such as shown in FIG. 3 against damage during fabrication from excessive voltages, the excessive voltages arising from the antennas connected to the unitary gate conductor 31 and the active semiconductor region, i.e., the SOI layer 14 of the NFET during fabrication.

In accordance with a further embodiment of the invention, a method of fabricating a CMOS structure having a PFET and an NFET with their gate conductors electrically connected includes determining when protect diodes are needed to address process induced charging damage and when protect diodes can be safely omitted from the CMOS structure. Such determination is valuable to practicing the invention, because protect diodes occupy area at the major surface of the semiconductor substrate that often cannot be used for any other purpose.

Accordingly, in a particular embodiment of the invention, protect diodes are incorporated only when certain conditions relating to the length to width ratios of the gate conductor and the active gate dielectric area of the NFET are present. When the conditions are not met, the protect diodes are not incorporated. Generally speaking, a protect diode is more likely to be needed when the antenna ratio is high. Stated another way, a protect diode is called for in the structure when the antenna ratio, that is, the ratio of the charge collecting area for each process to the device gate dielectric area is relatively high.

This invention can be used to determine checking rules for charging damage for circuits that are more complex than the simple inverter used here to illustrate the issues. Table 1 indicates a variety of conditions under which protect diodes are considered necessary, as well as other conditions in which protect diodes are not considered to be necessary. In the chart below, the term "gate" refers to the gate conductor of the device, and the term S/D denotes the active SOI region, which is predominantly made up of the source and drain ("S/D") regions of the FET transistor device. The column denoted by the heading "Diffusions Connected" indicates whether the diffusion regions of the NFET and the PFET are conductively connected together, such as by way of the M3 metal layer conductive line as described above with reference to FIG. 1. A CMOS logic circuit such as a CMOS logic inverter can be provided in which the diffusion regions of the PFET and the NFET are conductively connected together. The two columns at the far right side of Table 1 indicate the outcomes. Specifically, the second column from the right edge of Table 1 indicates when a protect diode should be connected to the gate, and the last column at the right edge of the table indicates when a protect diode should be conductively connected to the source region or the drain region of the NFET device. In Table 1, the individual letters "S", "L", "Y" and "N" each individually by itself represent "small", "large", "yes", and "no", respectively.

TABLE 1

| Gate Antenna Ratio | NFET S/D Antenna Ratio | Diffusions Connected | Protect Diode to Gate Needed | S/D Protect Diode Needed |
|---|---|---|---|---|
| S | S | Y/N | N | N |
| L | S | Y/N | Y | N |
| L | L | N | Y | Y |
| S | L | N | N | Y |
| S | L | N | Y | Y |
| S | L | N | Y | Y |
| L | L | Y | Y | N |

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A chip including a hybrid complementary metal oxide semiconductor ("CMOS") structure, comprising:
 a bulk device disposed in a first region of a semiconductor substrate in conductive communication with an underlying bulk region of said substrate, said first region and said bulk region having a first crystal orientation, said bulk device further including a first gate conductor overlying said first region;
 a SOI device disposed in a semiconductor-on-insulator ("SOI") layer separated from said bulk region of said substrate by a buried dielectric layer, said SOI layer having a second crystal orientation different from said first crystal orientation, said SOI device including a second gate conductor overlying said SOI layer of said substrate;
 a first diode disposed in a second region of said substrate in conductive communication with said bulk region, said first diode having a cathode in conductive communication with at least said first gate conductor and having an anode in conductive communication with said bulk region, said first diode having a breakdown voltage in excess of which said first diode is highly conductive, such that said first diode is operable to conduct a discharge current to said bulk region when a voltage on said first gate conductor exceeds said breakdown voltage; a second diode disposed in a third region of said substrate in conductive communication with said bulk region, said second diode having a cathode in conductive communication with at least one of a source region or a drain region of at least said SOI device and an anode in conductive communication with said bulk region, said second diode having a breakdown voltage in excess of which said second diode is highly conductive, such that said second diode is operable to conduct a discharge current to said bulk region when a voltage on said at least one of said source region or said drain region exceeds said breakdown voltage, wherein said cathode of said first diode vertically overlies said anode of said first diode and said cathode of said second diode vertically overlies said anode of said second diode; and a first conductive line conductively connecting one of a source region of said bulk device or a drain region of said bulk device to one of a source region of said SOI device or a drain region of said SOI device, wherein a conduction path between said first gate conductor and said cathode of said first diode includes a second conductive line, said second conductive line being disposed at a greater height from a major surface of said semiconductor substrate than said first gate conductor.

2. The chip as claimed in claim 1, wherein said bulk device includes a p-type field effect transistor ("PFET") and said SOI device includes an n-type field effect transistor ("NFET"), said chip further comprising a higher metal wiring pattern provided above said gate conductor layer, said second gate conductor being in conductive communication with said first gate conductor through said higher metal wiring pattern.

3. The chip as claimed in claim 1, wherein said first gate conductor and said second gate conductor are portions of a unitary unbroken gate conductor extending over said major surface of said substrate.

4. The chip as claimed in claim 2, wherein said crystal orientation of said NFET is <001> and said crystal orientation of said PFET is <110>.

5. The chip as claimed in claim 1, wherein a conduction path between said at least one of said source region or said drain region and said cathode of said second diode includes a third conductive line, wherein said first conductive line is disposed at a greater height from said major surface of said semiconductor substrate than said second and third conductive lines.

* * * * *